(12) United States Patent
Minami

(10) Patent No.: US 10,951,842 B2
(45) Date of Patent: Mar. 16, 2021

(54) IMAGING DEVICE, CAMERA, AND IMAGING METHOD

(71) Applicant: Panasonic Intellectual Property Management Co., Ltd., Osaka (JP)

(72) Inventor: Takeo Minami, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 16/416,197

(22) Filed: May 18, 2019

(65) Prior Publication Data

US 2019/0273878 A1   Sep. 5, 2019

Related U.S. Application Data

(63) Continuation of application No. PCT/JP2017/046597, filed on Dec. 26, 2017.

(30) Foreign Application Priority Data

Dec. 27, 2016 (JP) .............................. JP2016-254545

(51) Int. Cl.
*H04N 5/355* (2011.01)
*H04N 5/235* (2006.01)
(Continued)

(52) U.S. Cl.
CPC ....... *H04N 5/35536* (2013.01); *H01L 27/146* (2013.01); *H04N 5/2353* (2013.01);
(Continued)

(58) Field of Classification Search
CPC .... H04N 5/35536; H04N 5/353; H04N 5/374; H04N 5/2353; H04N 5/243;
(Continued)

(56) References Cited

U.S. PATENT DOCUMENTS 7,202,463 B1   4/2007 Cox
9,100,589 B1 *  8/2015 Geiss .................... H04N 5/265
(Continued)

FOREIGN PATENT DOCUMENTS

GB   2289981 A   12/1995
JP   1-269386    10/1989
(Continued)

OTHER PUBLICATIONS

International Search Report (ISR) (with English Translation) and Written Opinion dated Mar. 6, 2018 in International (PCT) Application No. PCT/2017/046597.
(Continued)

*Primary Examiner* — Mekonnen D Dagnew
(74) *Attorney, Agent, or Firm* — Renner, Otto, Boisselle & Sklar, LLP

(57) ABSTRACT

An imaging device includes: a solid-state imaging element that includes a plurality of pixels arranged in rows and columns and configured to be read out nondestructively; and an image processor that performs image processing on a current image using an analysis result of a suitable image. The suitable image is obtained from the solid-state imaging element when an amount of signal charge accumulated in the plurality of pixels is greater than or equal to a first threshold that is predetermined, and the current image is obtained from the solid-state imaging element after a first exposure corresponding to conditions of image capturing.

16 Claims, 10 Drawing Sheets

(51) Int. Cl.
  *H04N 5/243*    (2006.01)
  *H04N 5/374*    (2011.01)
  *H04N 9/31*    (2006.01)
  *H01L 27/146*    (2006.01)
  *H04N 5/353*    (2011.01)

(52) U.S. Cl.
  CPC ............ *H04N 5/243* (2013.01); *H04N 5/353* (2013.01); *H04N 5/374* (2013.01); *H04N 5/3742* (2013.01); *H04N 9/3182* (2013.01)

(58) Field of Classification Search
  CPC .... H04N 5/3742; H04N 9/3182; H04N 9/735; H01L 27/146; H01L 51/42
  See application file for complete search history.

(56) References Cited

U.S. PATENT DOCUMENTS

| | | |
|---|---|---|
| 2003/0095189 A1 | 5/2003 | Liu |
| 2005/0111696 A1* | 5/2005 | Baer ............... H04N 7/188 382/103 |
| 2007/0041063 A1 | 2/2007 | Kitada et al. |
| 2007/0171298 A1 | 7/2007 | Kurane |
| 2007/0223904 A1* | 9/2007 | Bloom ............... H04N 9/04557 396/100 |
| 2008/0049129 A1 | 2/2008 | Meacham |
| 2008/0055440 A1 | 3/2008 | Pertsel |
| 2013/0150713 A1 | 6/2013 | Takei |
| 2013/0155282 A1 | 6/2013 | Golding |
| 2016/0006966 A1 | 1/2016 | Murakami et al. |
| 2016/0093664 A1 | 3/2016 | Solhusvik |
| 2016/0255263 A1* | 9/2016 | Tanaka ............... H04N 5/2356 348/230.1 |

FOREIGN PATENT DOCUMENTS

| | | |
|---|---|---|
| JP | 2008-042180 | 2/2008 |
| JP | 2016-019090 | 2/2016 |
| WO | 2010084493 W | 7/2010 |

OTHER PUBLICATIONS

European Search Report for the corresponding European patent application No. 17886845.1 dated Jan. 31, 2020.

* cited by examiner

IMAGING DEVICE, CAMERA, AND IMAGING METHOD

CROSS REFERENCE TO RELATED APPLICATIONS

This application is a U.S. continuation application of PCT International Patent Application Number PCT/JP2017/046597 filed on Dec. 26, 2017, claiming the benefit of priority of Japanese Patent Application Number 2016-254545 filed on Dec. 27, 2016, the entire contents of which are hereby incorporated by reference.

BACKGROUND

1. Technical Field

The present disclosure relates to an imaging device, a camera including the imaging device, and an imaging method of the imaging device.

2. Description of the Related Art

A conventional imaging device that captures an image with an image sensor has been known (for example, see Japanese Unexamined Patent Application Publication No. 2008-042180).

SUMMARY

When the accumulated signal charge is at a saturation level (an amount of charge at which saturation occurs), or the accumulated signal charge is at an insufficient level at a time of image capturing, image processing such as auto white balance (AWB) may not be performed correctly. An imaging device is desired to perform image processing more appropriately.

In view of the above, an object of the present disclosure is to provide an imaging device, a camera, and an imaging method for performing image processing more appropriately.

In order to achieve the above object, an imaging device according to one aspect of the present disclosure includes: a solid-state imaging element that includes a plurality of pixels arranged in rows and columns and configured to be read out nondestructively; and an image processor that performs image processing on a current image using an analysis result of a suitable image. The suitable image is obtained from the solid-state imaging element when an amount of signal charge accumulated in the plurality of pixels is greater than or equal to a first threshold that is predetermined, and the current image is obtained from the solid-state imaging element after a first exposure corresponding to conditions of image capturing.

A camera according to one aspect of the present disclosure includes: the imaging device described above and a display that displays a captured image.

An imaging method according to one aspect of the present disclosure includes: obtaining, from a solid-state imaging element that includes a plurality of pixels arranged in rows and columns and configured to be read out nondestructively, a suitable image obtained when an amount of signal charge accumulated in the plurality of pixels is greater than or equal to a threshold that is predetermined; and performing image analysis on the suitable image obtained, and performing image processing, using an analysis result of the suitable image, on a current image obtained from the solid-state imaging element after an exposure corresponding to conditions of image capturing.

The imaging device, the camera, and the imaging method according to one aspect of the present disclosure enable more appropriate image processing.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENT

In the following, an imaging device, a camera, and an imaging method according to one aspect of the present disclosure are described in detail with reference to the drawings. Note that, the embodiment described below shows preferred examples of the present disclosure. Thus, numerical values, shapes, materials, structural elements, arrangement and connection configuration of the structural elements, steps, and an order of the steps shown in the following embodiments are mere examples, and are not intended to limit the present disclosure. Thus, among the structural components in the embodiment below, structural elements not recited in any one of independent claims which indicate the broadest concepts of the present disclosure are described as optional structural elements.

Note that the accompanying drawings and the following description are provided to help a person skilled in the art to fully understand the present disclosure, and are not intended to limit the subject matter defined in the appended claims. Moreover, each diagram is a schematic diagram and is not necessarily illustrated precisely.

Embodiment

Hereinafter, an embodiment is described with reference to FIG. 1 to FIG. 8.

[1. Overall Configuration of Imaging Device]

Figure 1:
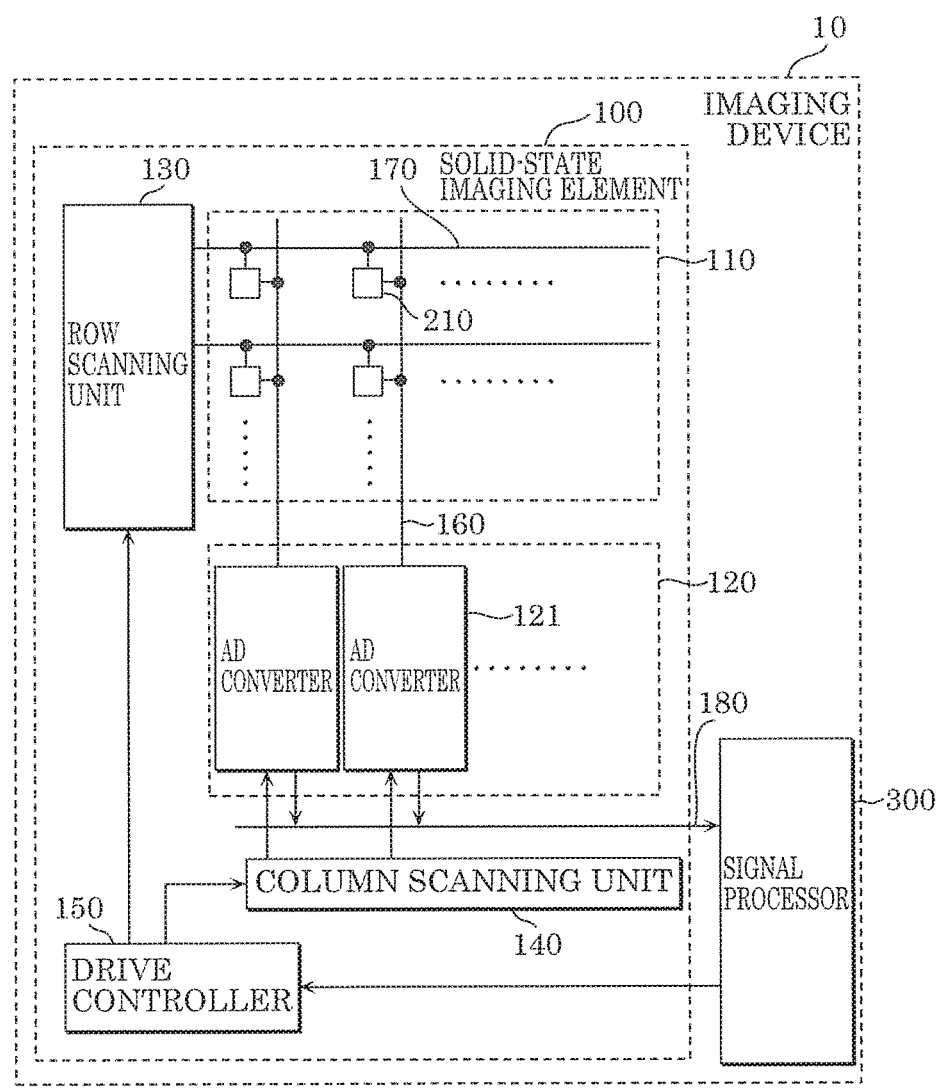
FIG. 1 is a block diagram illustrating an overall configuration of an imaging device according to an embodiment.

First, an overall configuration of an imaging device according to the present embodiment is described with reference to FIG. 1. FIG. 1 is a block diagram illustrating an overall configuration of imaging device 10 according to the present embodiment. Imaging device 10 illustrated in FIG. 1 includes solid-state imaging element 100, signal processor 300, display 500 (see FIG. 3), and operation unit 600 (see FIG. 3). Furthermore, solid-state imaging element 100 includes pixel array 110, column analog-to-digital (AD) converter 120, row scanning unit 130, column scanning unit 140, and drive controller 150. In pixel array 110 and a region surrounding pixel array 110, column signal line 160 is disposed for each column of pixels, and scanning line 170 is disposed for each row of pixels. Note that, in FIG. 1, display 500 and operation unit 600 included in imaging device 10 are not illustrated.

Pixel array 110 is an imaging unit in which a plurality of pixels 210 are disposed in rows and columns.

Column analog-to-digital converter (AD converter) 120 converts signals (analog signals) input from each column signal line 160 into digital signals, and obtains, holds, and outputs the digital values corresponding to the amounts of light received by respective pixels 210.

Row scanning unit 130 functions to control a reset operation, a charge accumulation operation, and a reading operation for pixels 210 per row.

Column scanning unit 140 sequentially outputs the digital values of one row held in column AD converter 120 to row signal line 180 to cause signal processor 300 to output the digital values.

Drive controller 150 controls row scanning unit 130 and column scanning unit 140 by supplying various control signals to row scanning unit 130 and column scanning unit 140. Drive controller 150 supplies various control signals to row scanning unit 130 and column scanning unit 140, for example, based on control signals from signal processor 300.

Imaging device 10 according to the present embodiment is an imaging device for capturing still images, for example.

[2. Configuration of Solid-State Imaging Element]

Figure 2:
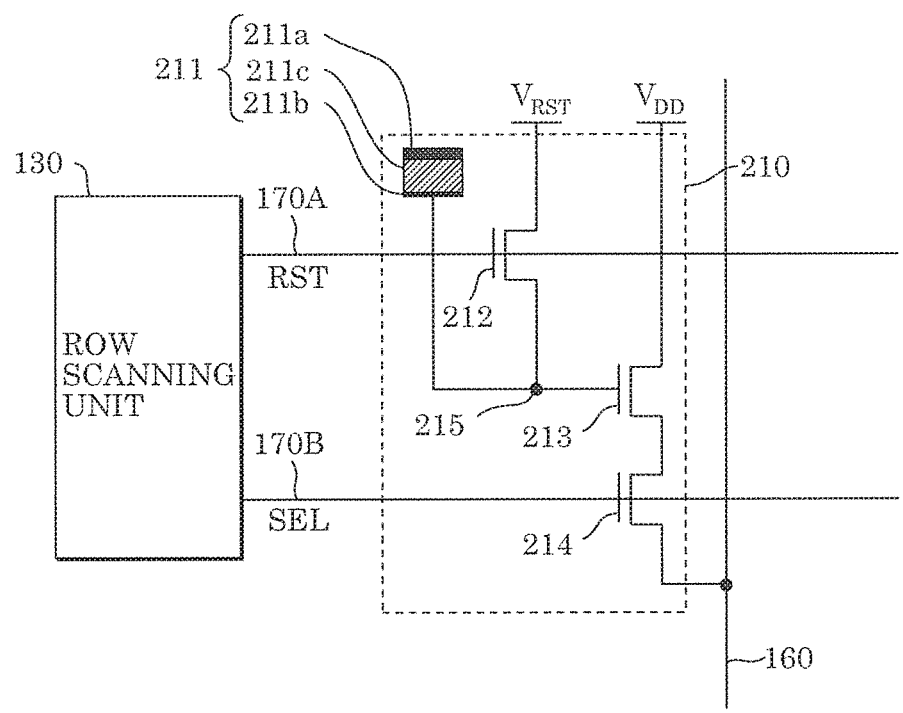
FIG. 2 illustrates an example of a circuit configuration of a pixel according to the embodiment.

Next, a configuration of solid-state imaging element 100 is described in detail with reference to FIG. 1 and FIG. 2.

[2-1. Pixel]

First, each pixel 210 is described with reference to FIG. 2. FIG. 2 illustrates an example of a circuit configuration of pixel 210 according to the present embodiment.

Pixel 210 includes photoelectric conversion element 211, reset transistor 212, amplification transistor 213, selection transistor 214, and charge accumulator 215.

Photoelectric conversion element 211 is a photoelectric converter that photoelectrically converts the received light into signal charge (pixel charge). Specifically, photoelectric conversion element 211 includes upper electrode 211a, lower electrode 211b, and photoelectric conversion film 211c interposed between the upper and lower electrodes. Photoelectric conversion film 211c includes a photoelectric conversion material that generates charge corresponding to the received light. In the present embodiment, photoelectric conversion film 211c includes an organic photoelectric conversion film containing organic molecules that highly absorb light. In other words, photoelectric conversion element 211 according to the present embodiment is an organic photoelectric conversion element including an organic photoelectric conversion film, and solid-state imaging element 100 is an organic sensor including the organic photoelectric conversion element. Note that the organic photoelectric conversion film extends across a plurality of pixels 210. Each of pixels 210 includes the organic photoelectric conversion film.

The light transmissivity of the organic photoelectric conversion film changes when the voltage applied to the organic photoelectric conversion film changes. In other words, a shutter function can be achieved by adjusting the voltage applied to the organic photoelectric conversion film. This achieves switching substantially all pixels 210 including the organic photoelectric conversion film at once between an exposed state and a light-blocking state, and thus a global shutter can be achieved without adding an element, such as memory. Therefore, distortion (rolling distortion) that occurs by performing readout by a rolling shutter can be reduced.

The thickness of photoelectric conversion film 211c is approximately 500 nm, for example. Photoelectric conversion film 211c is formed using a vacuum evaporation technique, for example. The organic molecules highly absorb light throughout the wavelength range of visible light of approximately from 400 nm to 700 nm.

Note that photoelectric conversion element 211 included in pixel 210 according to the present embodiment is not limited to include the organic photoelectric conversion film as described above. Photoelectric conversion element 211 may be a photodiode including an inorganic material, for example.

Upper electrode 211a is an electrode disposed opposite to lower electrode 211b, and is formed on photoelectric conversion film 211c to cover photoelectric conversion film 211c. In other words, upper electrode 211a is formed to extend across pixels 210. Upper electrode 211a includes a transparent conductive material (for example, ITO: indium, titanium, and tin) to allow light to enter photoelectric conversion film 211c.

Lower electrode 211b is an electrode for extracting electrons or positive holes generated in photoelectric conversion film 211c disposed between upper electrode 211a and lower electrode 211b. Upper electrode 211a is opposite to lower electrode 211b. Lower electrode 211b is included in each pixel 210. Lower electrode 211b includes Ti, TiN, Ta, Mo, etc., for example.

Charge accumulator 215 is connected to photoelectric conversion element 211 and accumulates the signal charge extracted via lower electrode 211b.

Reset transistor 212 includes a drain to which reset voltage $V_{RST}$ is supplied, and a source connected to charge accumulator 215. Reset transistor 212 resets (initializes) the potential of charge accumulator 215. Specifically, when a predetermined voltage is supplied to the gate of reset transistor 212 from row scanning unit 130 via reset scanning line 170A (reset transistor 212 is turned on), reset transistor 212 resets the potential of charge accumulator 215. When the supply of the predetermined voltage is stopped, signal charge is accumulated in charge accumulator 215 (exposure is started).

Amplification transistor 213 includes a gate connected to charge accumulator 215, and a drain to which voltage $V_{DD}$ is supplied. Amplification transistor 213 outputs a pixel signal corresponding to the amount of signal charge accumulated in charge accumulator 215.

Selection transistor 214 includes a drain connected to the source of amplification transistor 213, and a source connected to column signal line 160. Selection transistor 214 determines a timing at which the pixel signal is output from amplification transistor 213. Specifically, when a predetermined voltage is supplied to the gate of selection transistor 214 from row scanning unit 130 via selection scanning line 170B, the pixel signal is output from amplification transistor 213.

Pixel 210 having the above configuration can be read out nondestructively. The nondestructive readout here means reading out a pixel signal corresponding to the amount of charge (signal charge) during the exposure without destroying the charge accumulated in charge accumulator 215. Note that "during the exposure" is used to mean any timing within the exposure time.

[2-2. Other Configurations]

With reference to FIG. 1 again, column AD converter 120 includes AD converters 121 that are disposed for respective column signal lines 160. Each AD converter 121 is a 14-bit AD converter, for example. AD converter 121 converts, for example, analog pixel signals that are output from pixels 210 into digital pixel signals by the ramp method, and outputs the digital values corresponding to the amount of the received light in pixels 210. AD converter 121 includes a comparator and an updown counter (not illustrated).

Here, AD conversion with the ramp method is analog-to-digital conversion using a ramp wave. In the method, when an analog input signal is input, a ramp wave whose voltage increases with a certain gradient is generated, a duration from the ramp wave is generated until the voltages of both signals (the input signal and the ramp wave) correspond to each other is measured, and the measured duration is output as a digital value. The comparator compares the voltage of a column signal with the voltage of a reference signal input as the ramp wave, and outputs a signal indicating the timing at which the voltage of the reference signal corresponds to the voltage of the column signal.

The updown counter performs down-counting (or up-counting) in a period starting from after the reference signal is input to the comparator until the reference signal reaches the voltage of the column signal that indicates a reference component. Subsequently, the up down counter performs up-counting (or down-counting) in a period starting from after the reference voltage is input to the comparator until the reference signal reaches the voltage of the column signal that indicates the reference component. Consequently, the digital value corresponding to the difference obtained by subtracting the reference component from the signal component of the column signal is held.

The digital values held in each updown counter are sequentially output to row signal line 180, and are output to signal processor 300 via an output circuit (output buffer etc., although not illustrated).

Drive controller 150 controls the reset operation, accumulation operation of charge, and readout operation for pixels 210, or the output operation of digital signals from AD converter 121 to signal processor 300 by controlling row scanning unit 130 and column scanning unit 140.

For example, when drive controller 150 receives a readout instruction from signal processor 300, drive controller 150 controls row scanning unit 130 and causes row scanning unit 130 to sequentially apply a predetermined voltage to selection scanning line 170B and output pixel signals (analog values). Furthermore, drive controller 150 controls column scanning unit 140, and outputs sequentially the pixel signals (digital values) held in AD converter 121 to signal processor 300.

[3. Configuration of Signal Processor]

Figure 3:
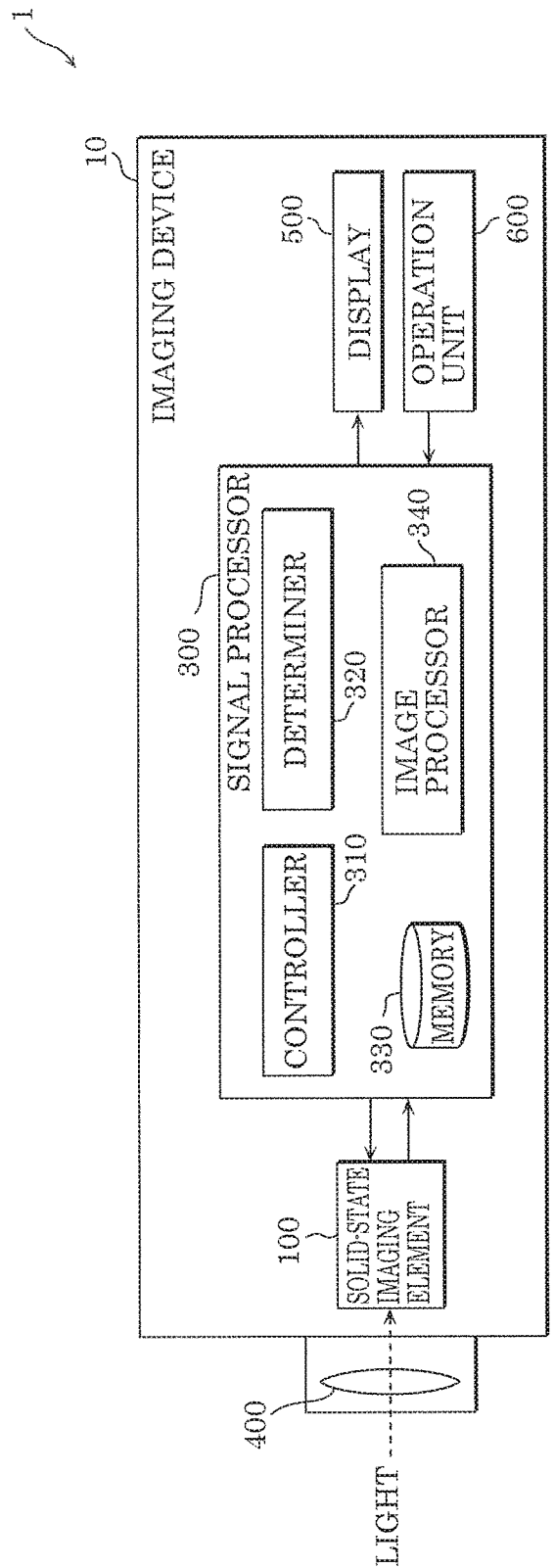
FIG. 3 is a functional block diagram of a camera equipped with the imaging device according to the embodiment.

Next, signal processor 300 is described with reference to FIG. 3. FIG. 3 is a functional block diagram of camera 1 equipped with imaging device 10 according to the present embodiment. Camera 1 illustrated in FIG. 3 includes solid-state imaging element 100, signal processor 300, lens 400, display 500, and operation unit 600. Signal processor 300 includes controller 310, determiner 320, memory 330, and image processor 340.

The light that has passed lens 400 enters solid-state imaging element 100. Signal processor 300 drives solid-state imaging element 100, and obtains pixel signals (digital values) from solid-state imaging element 100. For example, controller 310 controls drive controller 150 to cause image processor 340 to obtain the pixel signals from solid-state imaging element 100. Image processor 340 performs predetermined signal processing on the pixel signals obtained from solid-state imaging element 100, and generates an image. The generated image is stored in memory 330. The generated image is output to display 500. Note that image processor 340 is not limited to perform predetermined signal processing on the pixel signals obtained from solid-state imaging element 100. For example, image processor 340 may store the pixel signals obtained from solid-state imaging element 100 in memory 330 as image data. Alternatively, the pixel signals obtained from solid-state imaging element 100 may be stored in memory 330 without being stored in image processor 340.

Controller 310 reads out a program from memory 330, and executes the program read out, for example. Although controller 310 has been described to control drive controller 150, controller 310 may control other elements. For example, controller 310 may control an exposure (start and end of exposure) of solid-state imaging element 100. Specifically, controller 310 may control the start and the end of exposure by adjusting the voltage applied to the organic photoelectric conversion film. For example, controller 310 applies a predetermined voltage to the organic photoelectric conversion film to cause solid-state imaging element 100 to be in a light-transmitting state, and stops applying the voltage to the organic photoelectric conversion film to cause solid-state imaging element 100 to be in a light-blocking state. The light-transmitting state is in a state in which photoelectric conversion element 211 receives light and signal charge is accumulated in charge accumulator 215. The light-blocking state is in a state in which light is blocked from entering photoelectric conversion element 211 and no signal charge is accumulated in charge accumulator 215. Note that controller 310 may switch between the light-transmitting state and the light-blocking state by a mechanical shutter. For example, when operation unit 600 receives an input from a user, controller 310 may perform control in accordance with the input. When operation unit 600 receives an instruction of capturing an image from the user, controller 310 may control lens 400 (specifically, a motor that controls the position of lens 400), and may adjust the focus on a subject, etc.

Determiner 320 determines whether the image obtained from solid-state imaging element 100 by nondestructive readout (also called a nondestructive readout image) is obtained when the amount of the signal charge (the amount of signals) accumulated in charge accumulator 215 is greater than or equal to a first threshold. The first threshold is the amount of charge that is predetermined as a correct exposure. For example, the first threshold is a value set in a range of at least 40% and at most 60% of the maximum amount of charge that can be accumulated in each of pixels 210. As one example, the first threshold is 50% of the maximum amount of charge that can be accumulated. For example, the first threshold may be the amount of charge corresponding to the lowest value of the brightness (pixel value) of an image that is necessary for processing an image properly in image processor 340.

For example, determiner 320 may compare the average value of the amounts of signal charge accumulated in all pixels 210 in solid-state imaging element 100 with the first threshold, and perform the above determination. Moreover, determiner 320 may compare the lowest value of the amounts of charge accumulated in all pixels 210 in solid-state imaging element 100 with the first threshold, and perform the above determination.

Note that the number of times of performing nondestructive readout during exposure is not particularly limited. The nondestructive readout may be performed at least once. For example, controller 310 controls the timing at which the nondestructive readout is performed, and determiner 320 performs the above determination for each of the nondestructive readout images obtained by the nondestructive readout. Controller 310 may control the timing at which the nondestructive readout is performed, based on the time required for the nondestructive readout and the time required for the determination by determiner 320. For example, controller 310 controls the timing at which the nondestructive readout is performed such that a next nondestructive readout image is obtained at a time when the determination by determiner 320 ends. This allows determiner 320 to sequentially perform the determination on the obtained nondestructive readout images.

Memory 330 functions as work memory of image processor 340. Memory 330 stores images processed by image processor 340. Specifically, memory 330 stores one or more images (nondestructive readout images) that are obtained from solid-state imaging element 100 by the nondestructive readout performed during and after exposure and on which the image processing is performed by image processor 340. As described above, the nondestructive readout images include an image obtained from solid-state imaging element 100 after the exposure ends. However, the image obtained from solid-state imaging element 100 after the exposure ends (also called "after a first exposure ends", which will be described later) is called a current image to distinguish the images. In other words, the current image is obtained from solid-state imaging element 100 after the exposure corresponding to conditions for image capturing (f-number, ISO speed, etc.). Note that the exposure corresponding to the conditions for image capturing is an example of the first exposure. Memory 330 also stores the current image. Note that when the nondestructive readout is performed a plurality of times, nondestructive readout images as many as the number of times that the nondestructive readout is performed are also obtained. Memory 330 may store all the nondestructive readout images, or may store one or more specific nondestructive readout images only.

Memory 330 may be implemented with dynamic random access memory (DRAM) or ferroelectric memory, for example. Note that memory 330 may be included in imaging device 10, and need not to be included in signal processor 300.

Image processor 340 performs image processing on the current image using the analysis result of a suitable image. Note that a suitable image is obtained from solid-state imaging element 100 when the amount of the signal charge accumulated in pixels 210 is greater than or equal to the first threshold, which is predetermined as a correct exposure. In other words, a suitable image is an image having a predetermined brightness (pixel values). Moreover, image processing here means image processing that cannot be performed correctly without an image having a predetermined brightness for performing the image processing. The image processing is, for example, white balance correction (for example, automatic white balance: AWB). When the image processing is white balance correction, image analysis is processing for obtaining a correction value (for example, a correction value for each color of RGB) to correct the white balance of the current image using a suitable image. In other words, image analysis is processing for obtaining an analysis result (for example, correction values) for performing predetermined image processing on the current image using a suitable image. Moreover, image processing is processing for correcting white balance of the current image by calculating the current image and the correction values (analysis result) obtained by the image analysis. In other words, image processing is processing performed on the current image by calculating the current image and the analysis result obtained by the image analysis.

Figure 4:
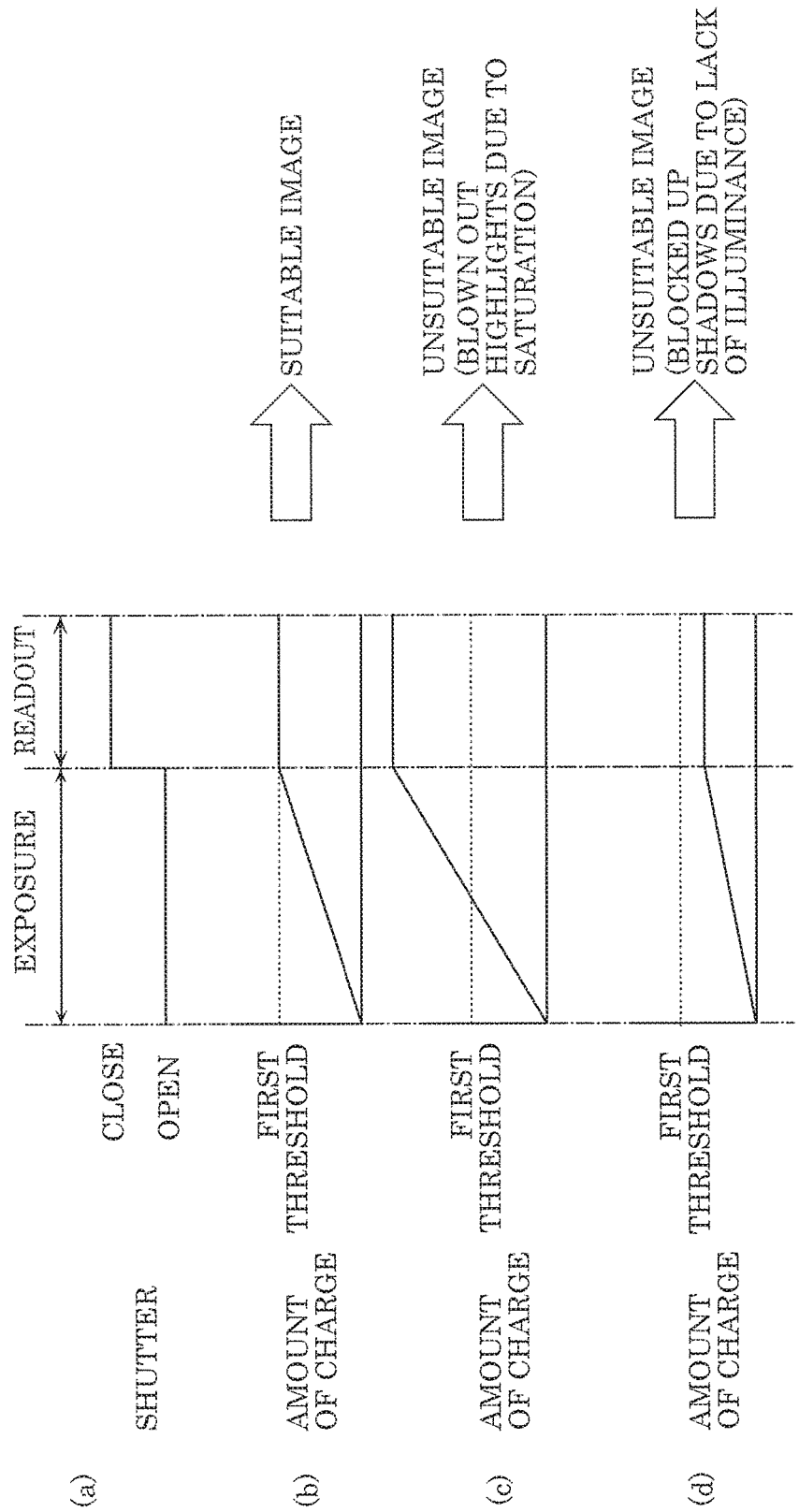
FIG. 4 illustrates relationships between amounts of charge and images according to the embodiment.

Here, the amount of charge accumulated in charge accumulator 215 and the image generated from the amount of charge are described with reference to FIG. 4. FIG. 4 is a diagram illustrating relationships between amounts of charge and images. Note that in (b) to (d) in FIG. 4, the vertical axes indicate the amount of charge, and the horizontal axes indicate time (exposure time and reading time).

In FIG. 4, (a) illustrates a timing at which a shutter is opened and closed. Note that the shutter may be implemented by adjusting the voltage applied to the organic photoelectric conversion film, or may be implemented by a mechanical shutter.

In FIG. 4, (b) illustrates the relationship between an amount of charge and an image when a suitable image can be obtained. When the shutter is opened and exposure is started, signal charge corresponding to the received light is accumulated in charge accumulator 215 in each pixel 210. After the shutter is closed and exposure is completed, the signal charge accumulation is stopped but the accumulated signal charge is retained. In FIG. 4, (b) shows the case where the amount of the accumulated signal charge is equal to the amount indicated by the first threshold. When the amount of signal charge is equal to the first threshold, the image generated by reading out the charge has a predetermined brightness. In other words, a correct analysis result can be obtained by performing image analysis on the image. Note that the image generated by reading out the charge when the amount of signal charge is equal to the first threshold is an example of the suitable image.

In FIG. 4, (c) illustrates the relationship between an amount of signal charge and an image when the accumulated amount of the signal charge greatly exceeds the amount indicated by the first threshold. For example, in the case where a subject is captured when the subject is backlit, a large amount of light is received, and thus the accumulated amount of charge may greatly exceed the first threshold. In such a case, the image generated by reading out the amount of charge may be an image that does not exhibit colors correctly. For example, when the signal charge is accumulated up to a maximum amount of charge that can be accumulated in each of pixels 210, the image generated by reading out the amount of signal charge will be an image having blown out highlights. The image having blown out highlights is an image that does not exhibit the colors correctly (unsuitable image). Thus, a correct analysis result cannot be obtained by performing image analysis on such an image. In other words, a correct analysis result cannot be obtained when the amount of accumulated charge is too much. For this reason, a second threshold may be set in a manner that will be described below.

In FIG. 4, (d) illustrates the relationship between an amount of charge and an image when the accumulated amount of the signal charge is under the amount indicated by the first threshold. For example, when a dark subject such as a night scene is captured, there is not enough illuminance and a small amount of charge is accumulated. Thus, the accumulated amount of charge may not reach the first threshold. In such a case, the image generated by reading out the amount of charge may be an image having blocked up shadows, for example. The image having blocked up shadows is an image that does not exhibit colors correctly (unsuitable image). Thus, a correct analysis result cannot be obtained by performing image analysis on such an image.

As illustrated in (c) or (d) in FIG. 4, when AWB is performed on the current image using an incorrect analysis result, an image that reproduces colors poorly is obtained. In other words, proper image processing cannot be performed.

Note that in the present embodiment, since solid-state imaging element 100 configured to be read out nondestructively is used, the accumulated signal charge is not destroyed even when nondestructive readout is performed. Moreover, the exposure indicated in FIG. 4 is a period from the start of exposure until the shutter is closed.

Image processor 340 may generate an image by performing a predetermined correction (one example of signal processing) on the pixel signals obtained from solid-state imaging element 100. For example, a nondestructive readout image may be generated by performing a predetermined correction (hereafter also called a first correction) on the pixel signals (hereafter also called first pixel signals) obtained by the nondestructive readout during the exposure. Moreover, a current image may be generated by performing a predetermined correction (hereafter also called a second correction) on the pixel signals (hereafter also called second pixel signals) obtained by performing the readout after the first exposure ends. Note that a predetermined correction is a correction of noise (for example, streaks on an image) generated in solid-state imaging element 100, correction of adjusting the amount of light of pixels 210 around lens 400, and so forth. Although it will be described later in details, the readout performed after the first exposure ends is nondestructive readout or destructive readout. The destructive readout is readout that destroys (resets) the accumulated signal charge, after a nondestructive readout image is obtained by nondestructive readout.

The nondestructive readout image generated with the pixel signals obtained by nondestructive readout during the exposure is overall a dark image. This is because the nondestructive readout image generated with the pixel signals obtained by nondestructive readout during the exposure is obtained when the exposure time is shorter than the exposure time of the current image generated with the pixel signals obtained by destructive readout performed after the exposure ends. Thus, the pixel signals obtained by nondestructive readout may be pixel signals whose gains are corrected by AD converter 121, for example. Specifically, the gains may be corrected to increase brightness. The gains do not need to be corrected for the pixel signals obtained by the destructive readout after exposure. In other words, different corrections may be performed in the first correction and the second correction. Corrections suitable for a nondestructive readout image and a current image may be performed. Such corrections make a nondestructive readout image brighter, for example. Note that the first pixel generated by nondestructive readout is an image in focus.

Note that the present embodiment has described the example in which one image processor 340 is used. However, the number of image processors 340 is not limited to this. For example, image processor 340 may include a first image processor that processes the first pixel signals, and a second image processor that processes the second pixel signals. This reduces the duration of pixel signal processing.

Display 500 is a display device that displays an image generated by signal processor 300. Examples of display 500 include a liquid crystal display monitor and an electronic view finder. Display 500 is capable of displaying various kinds of configuration information of a camera. For example, display 500 is capable of displaying image capturing conditions (such as f-number and ISO speed) when an image is captured.

Operation unit 600 is an input unit that receives an input from a user. Examples of operation unit 600 include a release button and a touch panel. For example, a touch panel is attached to a liquid crystal display monitor. Instructions to capture an image from a user, change image capturing conditions, and so on are received.

Note that, imaging device 10 may include an interface (not illustrated) for communication between an external circuit and solid-state imaging element 100 or signal processor 300. An example of the interface is a communication port including a semiconductor integrated circuit.

[4. Processing by Imaging Device]

Next, processing by imaging device 10 will be described. Note that the following describes the case where the image processing is white balance correction.

[4-1. Procedure of Processing by Imaging Device]

Figure 5:
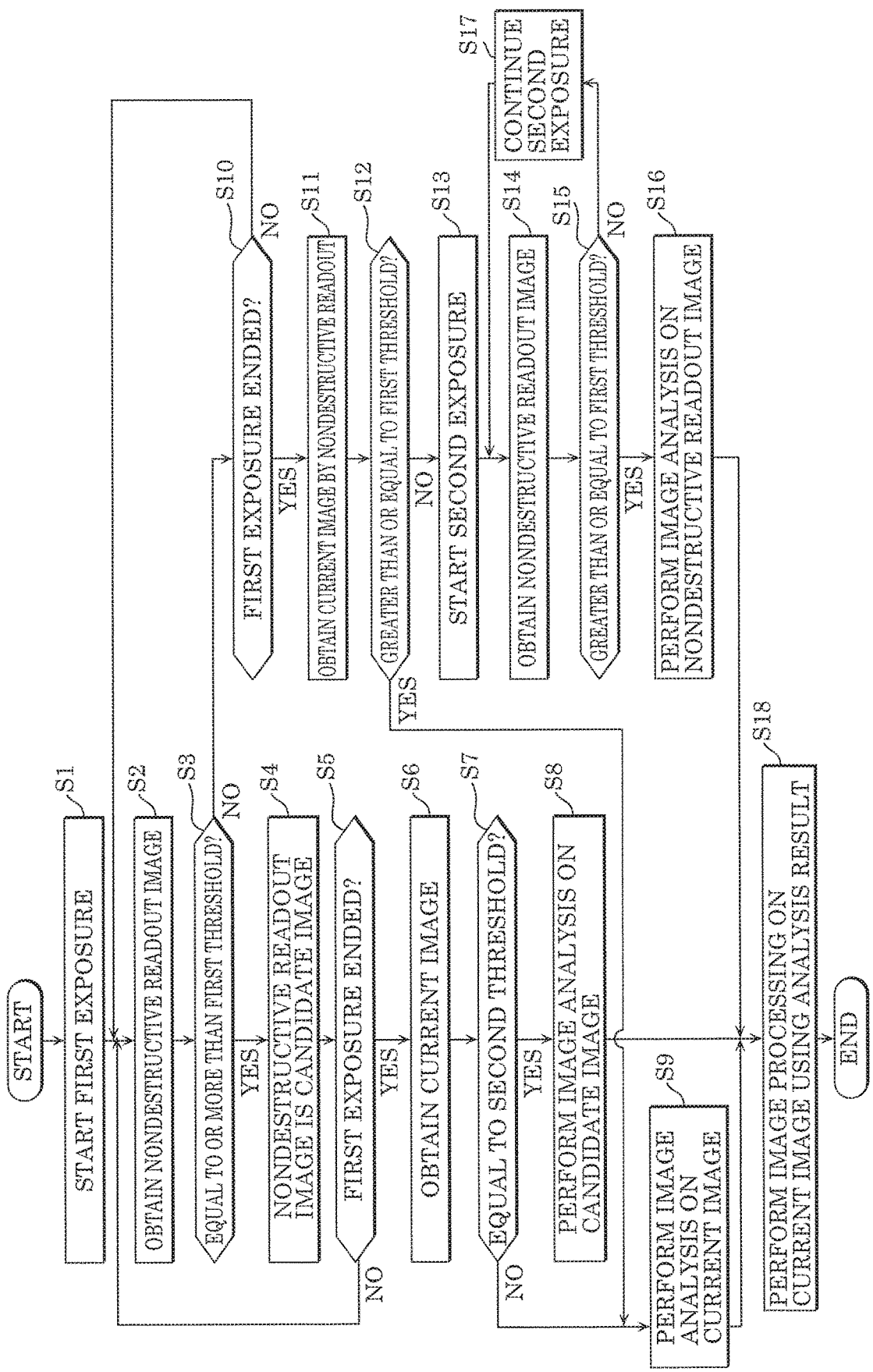
FIG. 5 is a flowchart illustrating an operation of the imaging device according to the embodiment.

The procedure of processing by imaging device 10 is described with reference to FIG. 5. FIG. 5 is a flow chart illustrating an operation of imaging device 10 according to the present embodiment.

First, for example, solid-state imaging element 100 starts the first exposure by being controlled by controller 310 (S1). Accordingly, the signal charge corresponding to the received light is accumulated in each of pixels 210. Specifically, the signal charge corresponding to the received light in photoelectric conversion element 211 is accumulated in charge accumulator 215.

Controller 310 controls the nondestructive readout in which signal charge is read out during an exposure without destroying the signal charge accumulated in charge accumulator 215 of each pixel 210. More specifically, controller 310 controls drive controller 150 so that the signal charge accumulated in column AD converter 120 for each row of pixels by performing AD conversion is converted into digital values (pixel signals) corresponding to the signal charge. The converted digital values are then sequentially output to signal processor 300 by column scanning unit 140. In other words, signal processor 300 obtains a nondestructive readout image by the nondestructive readout (S2). Note that after the nondestructive readout during the first exposure is performed, the potential of charge accumulator 215 is not reset by reset transistor 212.

Next, determiner 320 determines whether the nondestructive readout image obtained from solid-state imaging element 100 by the nondestructive readout is obtained from solid-state imaging element 100 when the amount of signal charge accumulated in pixels 210 is greater than or equal to the first threshold, which is predetermined as a correct exposure (S3). The number of times for performing nondestructive readout during the first exposure is not particularly limited as long as the nondestructive readout is performed at least once. Determiner 320 performs the above determination for each of the nondestructive readout images obtained by the nondestructive readout during the first exposure. Note that, for example, when determiner 320 determines that the image is obtained from solid-state imaging element 100 when the amount of signal charge accumulated in pixels 210 is greater than or equal to the first threshold (hereafter called a first determination), it is not necessary to perform the above determination for nondestructive readout images obtained after the determination. Moreover, when determiner 320 makes the first determination, controller 310 may control determiner 320 to stop the nondestructive readout during the first exposure. Since the image to be used for image analysis by image processor 340 is obtained by the first determination by determiner 320, the amount of processing (determination) performed by determiner 320 can be reduced.

In the case where determiner 320 determines that the nondestructive readout image obtained during the first exposure is obtained when the amount of accumulated signal charge is greater than or equal to the first threshold (Yes in S3), image processor 340 stores the nondestructive readout image in memory 330 as a candidate image for image analysis (hereafter also called an image for analysis) (S4). The candidate image is an image obtained from solid-state imaging element 100 by the nondestructive readout during the first exposure, and the amount of accumulated signal charge has reached the first threshold. For example, when a plurality of nondestructive readout images are determined to have an amount of accumulated signal charge greater than or equal to the first threshold, a nondestructive readout image obtained when the amount of accumulated signal charge is greater than or equal to the first threshold and the amount of accumulated signal charge is the closest to the first threshold may be selected as the candidate image. Other methods may be used to select the candidate image. Note that nondestructive readout images that are not selected as the candidate image (for example, images obtained when the amount of signal charge is less than or equal to the first threshold) do not need to be stored in memory 330.

Here, controller 310 determines whether the first exposure has ended (S5). Specifically, controller 310 determines whether the exposure of predetermined exposure period (period during which the shutter is open in FIG. 6A) in the first exposure has ended. The predetermined exposure period is a period determined in advance based on conditions of image capturing. When controller 310 determines that the first exposure has ended (Yes in S5), controller 310 causes the shutter to be closed. Specifically, controller 310 stops applying the voltage to the organic photoelectric conversion film to make a light-blocking state (a state in which the shutter is closed). The process subsequently proceeds to Step S6. Note that, when the switching between the light-transmitting state and the light-blocking state is performed by a mechanical shutter, the light-blocking state is made by closing the mechanical shutter.

When controller 310 determines the first exposure has not ended (No in S5), the process proceeds to Step S2. The nondestructive readout can thus be performed a plurality of times until the predetermined exposure period ends. Note that when the nondestructive readout is performed only once during the first exposure, the processing of Step S5 may be omitted.

Next, signal processor 300 obtains a current image by the destructive readout after the first exposure ends (S6). Note that it is not necessary to destroy the signal charge accumulated in charge accumulator 215 after the current image is obtained. In such a case, a current image is obtained by the nondestructive readout in Step S6.

Here, determiner 320 determines whether the amount of signal charge accumulated in pixels 210 in the obtained current image is equal to a second threshold greater than the first threshold (S7). The second threshold is a value at which the signal charge accumulated in pixels 210 is saturated (the maximum amount of charge that can be accumulated in each pixel 210), for example. In other words, when the amount of charge is equal to the second threshold, blown out highlights are generated in an image. Accordingly, correct image processing cannot be performed when the image having the amount of accumulated charge equal to the second threshold and having blown out highlights is used to perform image processing such as white balance correction. This is because the colors in the image are exhibited incorrectly due to the blown out highlights (the color of pixel 210 having the amount of signal charge equal to the second threshold is exhibited as white). Thus, the determination in Step S7 is performed. Note that the second threshold is not limited to the maximum amount of charge that can be accumulated in each pixel 210. The second threshold may be appropriately determined among values greater than the first threshold.

In the case where determiner 320 determines that the current image is obtained when the amount of signal charge accumulated in pixels 210 is equal to the second threshold, which is greater than the first threshold (Yes in S7), image processor 340 performs image analysis on the candidate image (S8). In this case, the candidate image (nondestructive readout image determined to be the candidate image in Step S4) is an example of the suitable image.

In the case where determiner 320 determines that the current image is obtained when the amount of signal charge accumulated in pixels 210 is less than the second threshold (No in S7), image processor 340 performs image analysis on the current image (S9). Although image analysis can also be performed on the candidate image, the candidate image and the current image are images obtained at different times (timings) during one image capturing. For this reason, when the brightness of a subject, etc. changes after the candidate image is obtained and before a current image is obtained, and image processing is performed on the current image using such a candidate image, image processing not including the change is performed. Therefore, in order to perform more suitable image processing on such a current image, image processing may be performed using the current image. In this case, the current image is an example of a suitable image.

Next, in determination by determiner 320 for the nondestructive readout image obtained during the first exposure, in the case where it is determined that the image is obtained when the amount of charge is not greater than or equal to the first threshold (not reaching the first threshold) (also called No in S3, or second determination), controller 310 determines whether the first exposure has ended (S10). Specifically, controller 310 determines whether the exposure for the predetermined exposure period (period in FIG. 6A during which the shutter is open) in the first exposure has ended. When controller 310 determines that the first exposure has ended (Yes in S10), controller 310 causes the shutter to be closed. Specifically, controller 310 stops applying the voltage to the organic photoelectric conversion film to make the light-blocking state (a state in which the shutter is closed). The process subsequently proceeds to Step S11. Note that, when the light-transmitting state and the light-blocking state are switched by a mechanical shutter, the light-blocking state is made by closing the mechanical shutter.

When controller 310 determines that the first exposure has not ended (No in S10), the process proceeds to Step S2. The nondestructive readout can thus be performed a plurality of times until the predetermined exposure period ends. Note that when the nondestructive readout is performed only once during the first exposure, the processing of Step S10 may be omitted.

Next, signal processor 300 obtains a current image by nondestructive readout after the first exposure corresponding to the image capturing conditions ends (S11). Determiner 320 determines whether the current image is obtained from solid-state imaging element 100 when the amount of signal charge accumulated in pixels 210 is greater than or equal to the first threshold that is predetermined as the correct exposure (S12).

When determiner 320 makes the first determination for the current image (Yes in S12), the process proceeds to Step S9 and image processor 340 performs image analysis on the current image. When the result is No in Step S3 and Yes in Step S12, the image on which image analysis can be performed correctly is only the current image among the images captured by the end of the first exposure. Thus, image analysis is performed on the current image. In this case, the current image is an example of the suitable image.

When determiner 320 makes the second determination for the current image (No in S12), an image (suitable image) having a predetermined brightness is not obtained. In other words, an image to be used for image analysis (image that enables correct image analysis) is not obtained at this time. Thus, after image processor 340 obtains the current image, controller 310 controls solid-state imaging element 100 to cause solid-state imaging element 100 to start the second exposure (S13). Specifically, controller 310 causes solid-state imaging element 100 to apply a predetermined voltage to the organic photoelectric conversion films to start the second exposure. In other words, the second exposure is an exposure performed after the current image is obtained. Note that, when the light-transmitting state and the light-blocking state are switched by a mechanical shutter, the second exposure is started by opening the mechanical shutter.

Since the current image is obtained by the nondestructive readout (the potential of charge accumulator 215 is not reset), the signal charge that has been accumulated when the first exposure ends is retained as it is in charge accumulator 215. Thus, the signal charge generated in the second exposure is further added to the signal charge accumulated in the first exposure by obtaining a current image by the nondestructive readout and the second exposure is performed after the current image is obtained. The number of times for performing the nondestructive readout during the second exposure is not particularly limited, as long as the nondestructive readout is performed at least once.

Signal processor 300 obtains a nondestructive readout image from solid-state imaging element 100 by nondestructive readout during the second exposure (S14), and determiner 320 determines whether the nondestructive readout image is obtained when the amount of the signal charge accumulated in pixels 210 is greater than or equal to the first threshold (S15).

The determination in Step S15 is performed on each of the nondestructive readout images obtained by the nondestructive readout during the second exposure. When determiner 320 makes the first determination for the nondestructive readout image (Yes in S15), image processor 340 performs image analysis on the nondestructive readout image (S16). In this case, the nondestructive readout image is an example of the suitable image. Note that when the first determination is performed on the nondestructive readout image, image processor 340 may obtain the image to be used for image analysis by destructive readout. When the result of determination for the nondestructive readout image is the first determination, controller 310 may stop the second exposure.

When determiner 320 makes the second determination for the nondestructive readout image (No in S15), controller 310 causes solid-state imaging element 100 to continue the second exposure (S17). Note that the second exposure may be continued until the result of Yes is obtained in Step S15, or may be performed for a predetermined period of time. Other than the above, the second exposure may be continued until operation unit 600 receives an instruction for stopping the second exposure from a user.

By continuing the second exposure until the result of Yes is obtained in Step S15, a suitable image for image processing can be obtained. When the second exposure is performed for a predetermined period and the amount of accumulated signal charge reaches the first threshold during the predetermined period, signal processor 300 can obtain a plurality of images read out when the amount of charge is greater than or equal to the first threshold. In other words, it is possible to select an image which is more suitable for image analysis from among the images. For example, in the case where the subject is moving, using an image when the signal charge reaches the first threshold (image obtained with a shorter second exposure time) makes it possible to perform image processing for reducing the influences due to the motion (motion blur, etc.) of the subject using the image.

Image processor 340 performs image processing on the current image using the analysis result in Step S8, Step S9, or Step S16 (S18). This enables image processing to be performed using the image analysis of the image having a predetermined brightness. Thus, more appropriate image processing is performed. When the image processing is AWB, the current image on which image processing is performed becomes an image that reproduces colors well.

Note that Step S7 and Step S9 do not need to be performed. For example, when the result is Yes in Step S3, image analysis may be performed on the candidate image as a suitable image, and image processing may be performed on the current image using the analysis result. This makes it possible to omit the processing (S7) in determiner 320, and thus the image processing can be accelerated. In this case, at least one of the suitable image and the current image is a nondestructive readout image.

[4-2. Amount of Charge and Procedure of Image Processing]

Figure 6A:
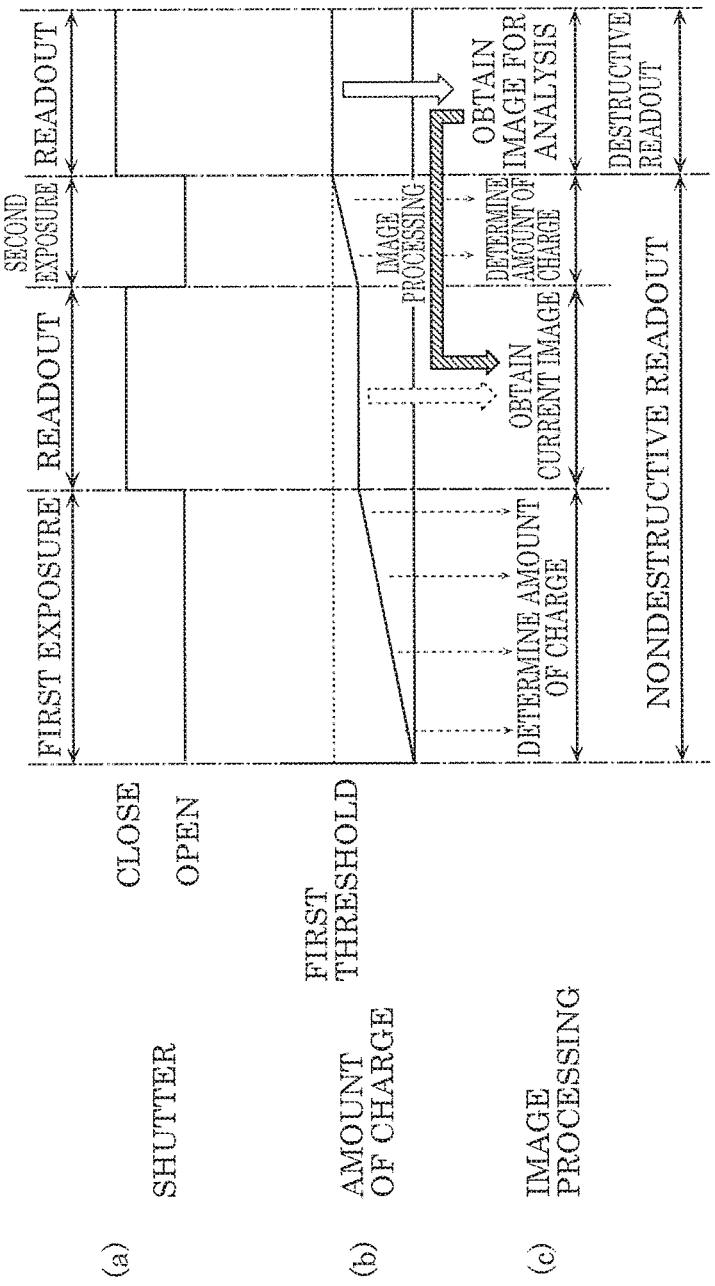
FIG. 6A illustrates a procedure of image processing with respect to an amount of charge according to the embodiment, when the amount of charge is less than a first threshold.
Figure 6B:
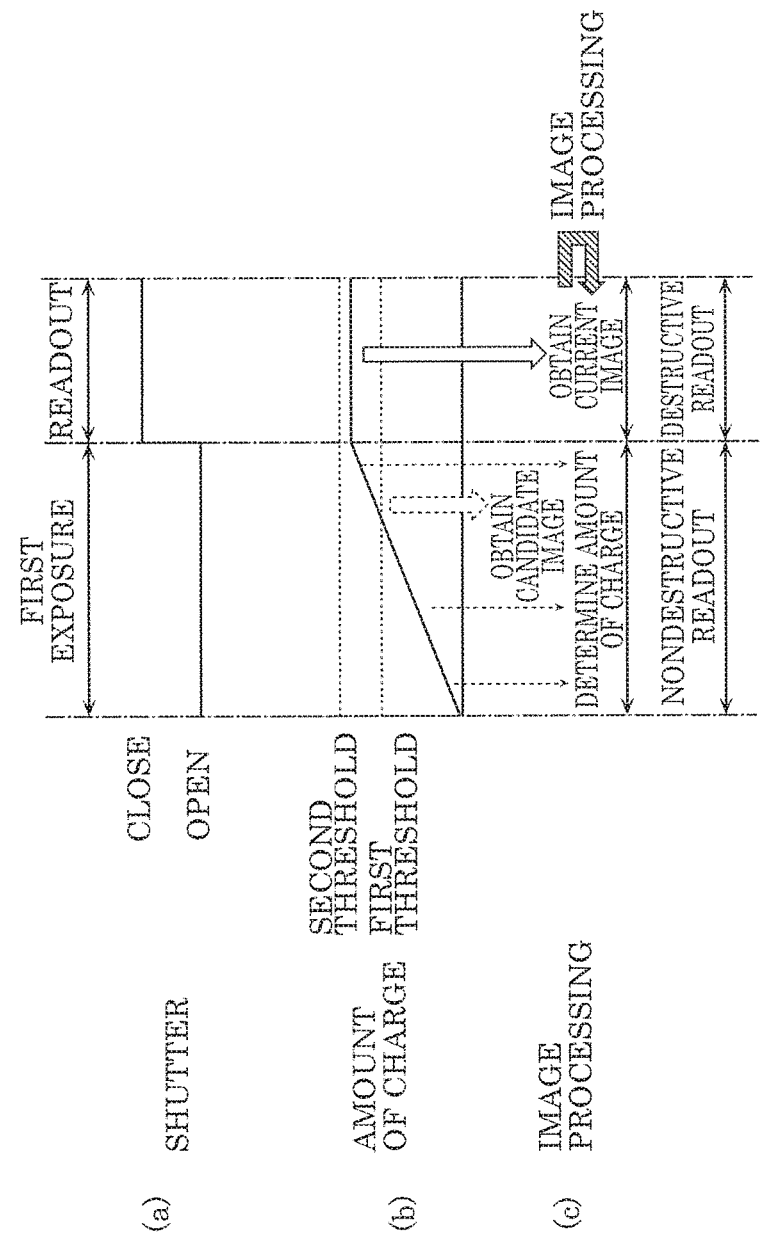
FIG. 6B illustrates a procedure of image processing with respect to an amount of charge according to the embodiment, when the amount of charge is greater than or equal to the first threshold and less than a second threshold.
Figure 6C:
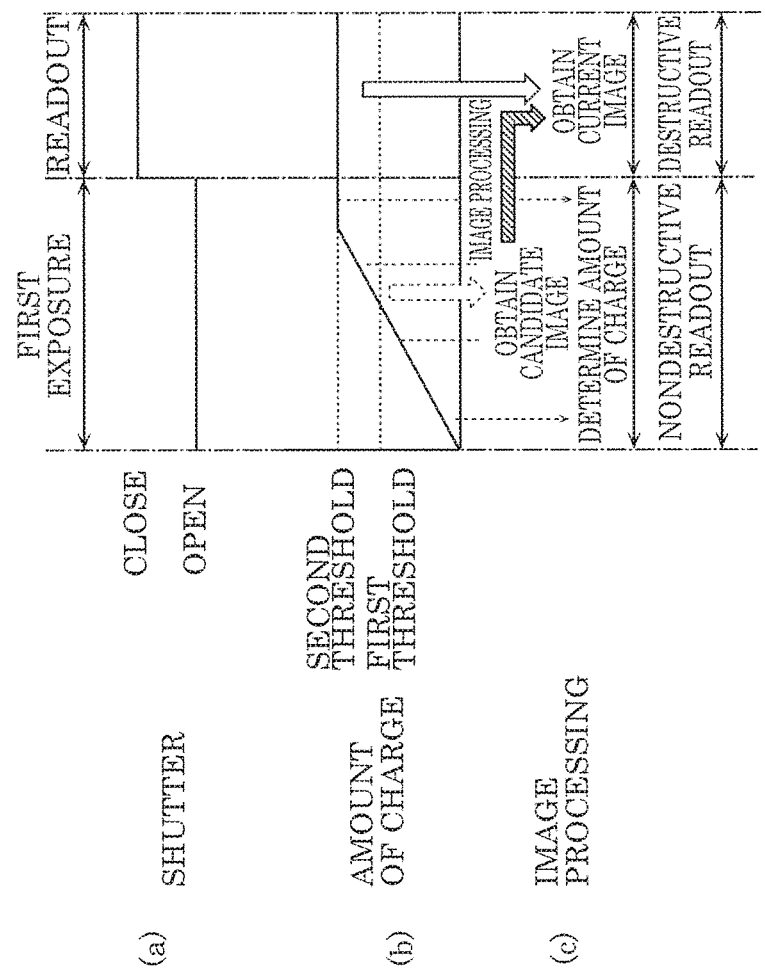
FIG. 6C illustrates a procedure of image processing with respect to an amount of charge, when the amount of charge according to the embodiment is equal to the second threshold.

Next, the amount of charge accumulated in imaging device 10 according to the present embodiment and the procedure of image processing are described further in detail with reference to FIG. 6A to FIG. 6C. Note that each (a) in FIG. 6A to FIG. 6C illustrates a timing at which a shutter is opened and closed. Each (b) in FIG. 6A to FIG. 6C illustrates a relationship between exposure time and an amount of accumulated charge, and each vertical axis indicates an amount of charge and each horizontal axis indicates time. Each (c) in FIG. 6A to FIG. 6C illustrates image processing over time.

First, the case where the amount of charge is less than the first threshold in the first exposure is described with reference to FIG. 6A. FIG. 6A illustrates a procedure of image processing with respect to the amount of charge, when the amount of charge is less than the first threshold.

The first exposure is started by opening the shutter (corresponding to S1 in FIG. 5). The first exposure is an exposure for predetermine time corresponding to conditions of image capturing (f-number and ISO speed). In other words, the period from when the shutter is opened until when the shutter is closed is the first exposure. The signal charge corresponding to the received light is accumulated in charge accumulator 215 during the first exposure. Controller 310 controls solid-state imaging element 100 and thereby signal processor 300 obtains an image by nondestructive readout during the first exposure (corresponding to S2 in FIG. 5). Determiner 320 determines whether the obtained image is obtained when the amount of charge is equal to or more than the first threshold ("determine amount of charge" in FIG. 6A) (corresponding to S3 in FIG. 5). Although the downward dashed arrows in (b) in FIG. 6A indicate that the nondestructive readout is performed, the number of times that the nondestructive readout is performed during the first exposure is not particularly limited. The nondestructive readout may be performed at least once. In FIG. 6A, the amount of charge has not reached the first threshold in the first exposure (corresponding to No in S3 in FIG. 5), and thus an image to be used for image analysis cannot be obtained at this point. In this case, when a current image is read out after the first exposure, the current image is read out by nondestructive readout (corresponding to S11 in FIG. 5). Accordingly, the signal charge accumulated during the first exposure is retained as it is in solid-state imaging element 100. Note that "after the first exposure" is, for example, a period from the end of the first exposure until a next exposure is started, and is intended to mean immediately after the first exposure.

Controller 310 then controls solid-state imaging element 100 and causes solid-state imaging element 100 to start the second exposure (corresponding to S13 in FIG. 5). An image is obtained by nondestructive readout during the second exposure (corresponding to S14 in FIG. 5), determiner 320 performs determination ("determine amount of charge" in FIG. 6A) (corresponding to S15 in FIG. 5) similar to Step S3. When determiner 320 makes the first determination, controller 310 controls solid-state imaging element 100 and causes the shutter to be closed. As illustrated in FIG. 6A, signal processor 300 obtains an image from solid-state imaging element 100 by destructive readout. The obtained image is an image that can be used for image analysis (image for analysis). Note that the image to be used for image analysis is not limited to the image obtained by the destructive readout. As shown in Step S16 of FIG. 5, a nondestructive readout image obtained by nondestructive readout may be used. The image to be used for image analysis may be an image obtained when the amount of charge has reached the first threshold during the second exposure.

As described above, when the amount of accumulated charge during the first exposure has not reached the first threshold, a current image is obtained by nondestructive readout, and after obtaining the current image, exposure is performed again (second exposure). Obtaining a current image by nondestructive readout allows the signal charge accumulated during the first exposure to remain accumulated in charge accumulator 215 without being destroyed. By further performing the second exposure, the signal charge generated during the second exposure is further accumulated. The image obtained by the nondestructive readout during the second exposure is an image brighter than the current image (image generated with a greater amount of charge). By performing image analysis on such an image, a more correct analysis result can be obtained than the case where the image analysis is performed on the current image obtained when the amount of charge is less than or equal to the first threshold. In other words, more suitable image processing can be performed on the current image.

Next, the case where the amount of charge is greater than or equal to the first threshold and less than the second threshold in the first exposure is described with reference to FIG. 6B. FIG. 6B illustrates a procedure of image processing with respect to an amount of charge, when the amount of charge is greater than or equal to the first threshold and less than the second threshold. Note that the same description as the description in FIG. 6A may be omitted.

In (b) in FIG. 6B, the signal charge is greater than or equal to the first threshold, and accumulated to a value lower than the second threshold during the first exposure (corresponding to Yes in S3 and No in S7 in FIG. 5). Thus, the current image to be obtained after the first exposure is also an image obtained when the amount of charge is greater than or equal to the first threshold and less than the second threshold. Thus, a correct image analysis can be performed using such a current image. In other words, in this case, image analysis is performed on the current image (corresponding to S9 in FIG. 5), and image processing can be performed on the current image using the analysis result.

Although (c) in FIG. 6B illustrates the case where the current image is obtained by destructive readout, the present disclosure is not limited to this. Although the example of performing image analysis using the current image has been described, the present disclosure is not limited to this. For example, image analysis may be performed on the candidate image (nondestructive readout image obtained when the amount of charge has reached the first threshold), which is illustrated in (b) in FIG. 6B. In other words, image analysis may be performed on an image obtained when the amount of charge is greater than or equal to the first threshold. Although (b) in FIG. 6B illustrates the case where a nondestructive readout image is obtained by nondestructive readout after a candidate image is obtained during the first exposure, the present disclosure is not limited to this.

As described above, in the case where the current image is obtained when the signal charge is greater than or equal to the first threshold and less than the second threshold, signal processor 300 perform image analysis on the current image. Accordingly, an analysis result including a change (for example, change in brightness) that has occurred in the subject during the period from when a candidate image is obtained until when a current image is obtained. Thus, more suitable image processing can be performed than the case where image analysis is performed on a candidate image obtained by nondestructive readout during the first exposure.

Next, the case where the amount of accumulated signal charge is equal to the second threshold in the first exposure is described with reference to FIG. 6C. FIG. 6C illustrates a procedure of image processing with respect to the amount of charge, when the amount of charge is equal to the second threshold. Note that the same description as in FIG. 6A may be omitted.

In (b) in FIG. 6C, the signal charge is accumulated to the second threshold, which is greater than the first threshold, during the first exposure (corresponding to Yes in S3 and in S7 in FIG. 5). The current image obtained when the amount of charge is equal to the second threshold is an image that does not exhibit colors correctly. For example, an image includes blown out highlights. Thus, a correct analysis result cannot be obtained by performing image analysis on such an image. Accordingly, image analysis is performed on the candidate image obtained during the first exposure (corresponding to S8 in FIG. 5). Since the candidate image is obtained when the signal charge is greater than or equal to the first threshold and lower than the second threshold, a correct analysis result can be obtained by performing image analysis on the candidate image. Although the current image includes blown out highlights etc., an image that more closely reproduces the subject can be obtained by performing image processing using the analysis result of the candidate image (for example, when the image processing is AWB, an image that reproduces colors well is obtained). Note that the current image is obtained by destructive readout, for example.

Imaging device 10 according to the present embodiment makes a determination by comparing the amount of charge and the thresholds (the first threshold and the second threshold) when a nondestructive readout image or a current image is obtained. Since image analysis can be performed on the image that is more suitable to the image analysis according to the determination result, a more correct analysis result can be obtained. Therefore, image processing can be more appropriately performed using such analysis result.

[5. Camera]

Figure 7:
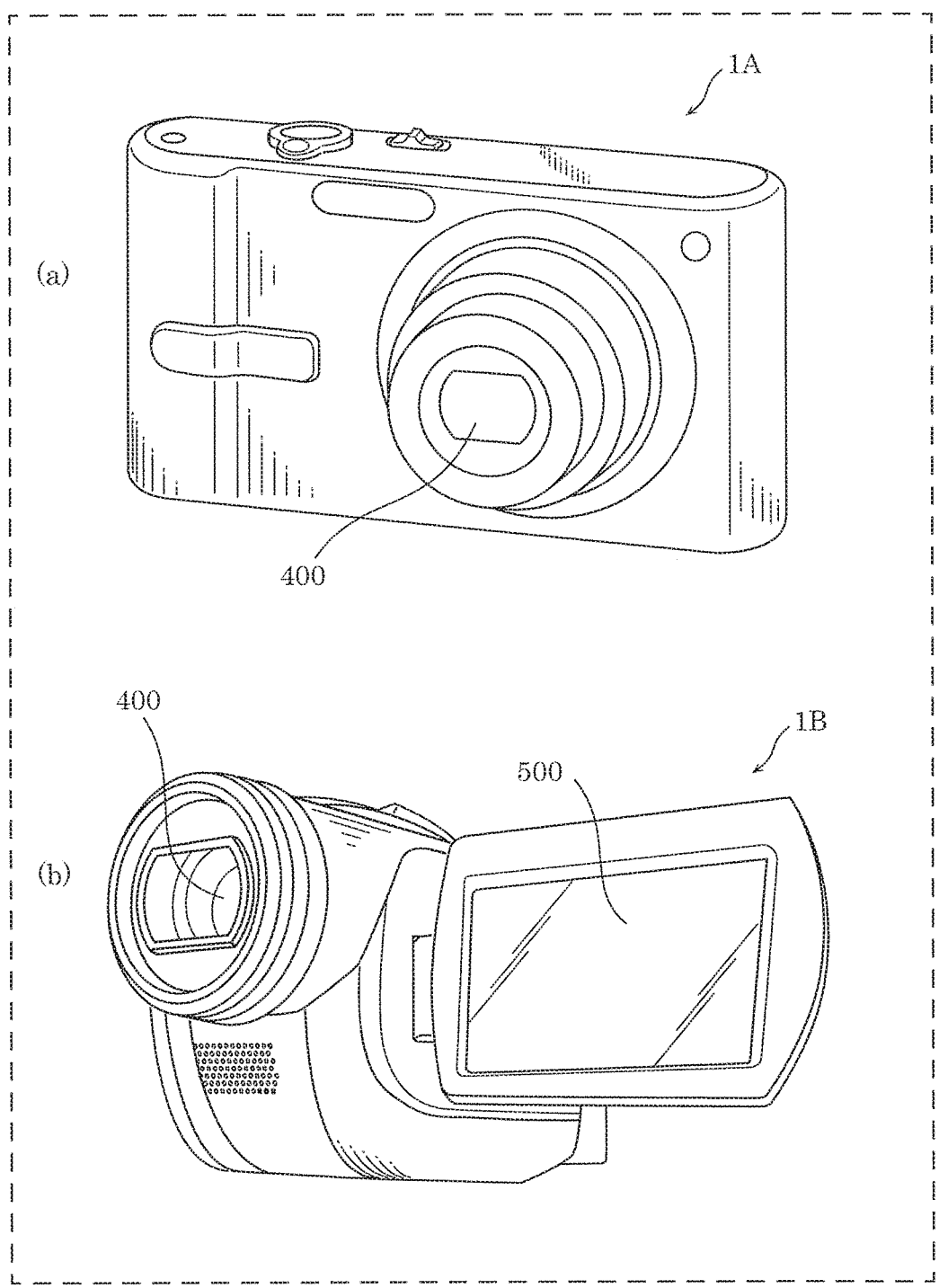
FIG. 7 illustrates external views of cameras each equipped with the imaging device according to the embodiment.

Examples of camera 1 equipped with imaging device 10 include digital still camera 1A illustrated in (a) in FIG. 7 and digital video camera 1B illustrated in (b) in FIG. 7. For example, image analysis can be performed on a suitable image by equipping imaging device 10 according to the present embodiment in cameras such as the camera illustrated in (a) in FIG. 7, or the camera illustrated in (b) in FIG. 7. Thus, as described above, the current image on which image processing has been performed more appropriately can be obtained, stored, or displayed.

When the first determination is made for the nondestructive readout image obtained by determiner 320, the second exposure will not be started. In this case, the current image on which image processing is performed is displayed on display 500.

Figure 8:
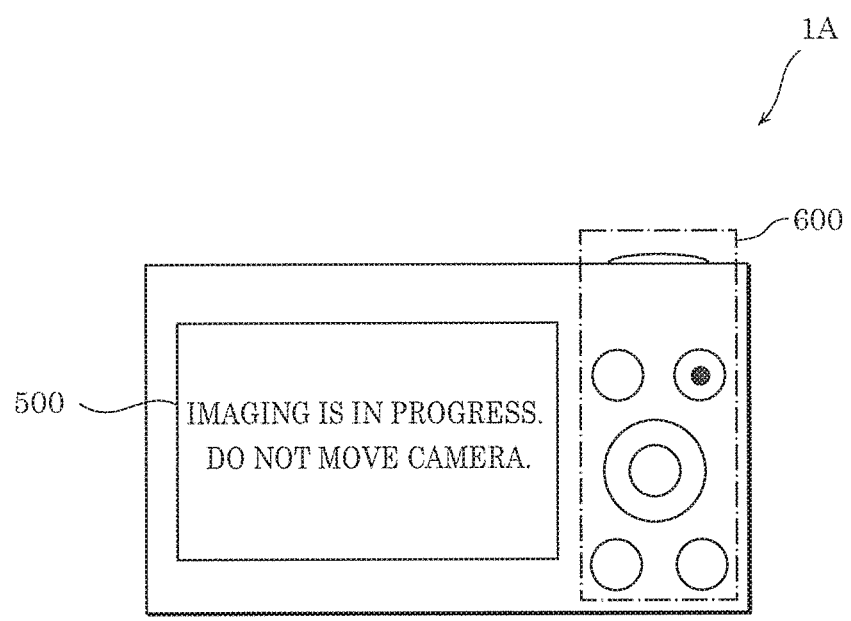
FIG. 8 illustrates an example of displaying information indicating that an exposure is being performed on a display of a camera according to the embodiment.

Meanwhile, the second exposure is started when the second determination is made by determiner 320 for the obtained current image. In this case, a user does not know whether the second exposure is being performed. Thus, controller 310 may display, on display 500 of camera 1, information indicating the second exposure is being performed, for example. For example, information as shown in FIG. 8 may be displayed on display 500 of digital still camera 1A. Although FIG. 8 illustrates an example in which only the information indicating that the second exposure is being performed is displayed, the current image obtained in Step S11 and the above information may be displayed simultaneously, for example.

[6. Effects Etc.]

As described above, imaging device 10 according to the present embodiment includes: solid-state imaging element 100 that includes a plurality of pixels 210 arranged in rows and columns and configured to be read out nondestructively; and image processor 340 that performs image processing on a current image using an analysis result of a suitable image. The suitable image is obtained from solid-state imaging element 100 when an amount of signal charge accumulated in the plurality of pixels 210 is greater than or equal to a first threshold that is predetermined. The current image is obtained from solid-state imaging element 100 after a first exposure corresponding to conditions of image capturing.

Thus, image processing is performed on the current image using the analysis result obtained from solid-state imaging element 100 when the amount of signal charge is greater than or equal to the first threshold. When an image to be used for image analysis is dark (the amount of signal charge is less than the first threshold), a correct analysis result cannot be obtained by performing image analysis on such an image. Thus, even when image processing is performed on the current image using such analysis result, proper image processing is not performed. When the image processing is AWB, the current image processed by the image processing may be an image that reproduces colors poorly. However, imaging device 10 according to the present embodiment performs image analysis on the image obtained when the amount of signal charge is greater than or equal to the first threshold, a more correct analysis result is obtained. Since the image processing is performed on the current image using this analysis result, more suitable image processing can be performed on the current image. When the image processing is AWB, the current image becomes an image that reproduces colors well.

Moreover, imaging device 10 further includes determiner 320 that determines whether an image from the solid-state imaging element 100 is obtained when the amount of signal charge is greater than or equal to the first threshold. In a case where determiner 320 makes a first determination, image processor 340 obtains the current image from solid-state imaging element 100 by destructive readout, the first determination indicating that a nondestructive readout image obtained from the solid-state imaging element 100 by nondestructive readout during the first exposure is obtained when the amount of signal charge is greater than or equal to the first threshold. In a case where determiner 320 makes a second determination, image processor 340 obtains the current image from solid-state imaging element 100 by the nondestructive readout, the second determination indicating that the nondestructive readout image is obtained from solid-state imaging element 100 when the amount of signal charge is not greater than or equal to the first threshold.

Accordingly, when determiner 320 makes the first determination on the nondestructive readout obtained by the nondestructive readout during the first exposure (in other words, a suitable image for image analysis is obtained), the current image is obtained by destructive readout, and thus the accumulated signal charge is reset. Thus, next image capturing can be performed. In other words, since the signal charge is reset when a suitable image is obtained, next image capturing can be performed. When determiner 320 makes the second determination (in other words, a suitable image for image analysis is not obtained), the current image is obtained by nondestructive readout, and thus the accumulated signal charge is retained (the signal charge is not reset). Accordingly, when the exposure is started again (the second exposure is started), the signal charge generated during the second exposure is further accumulated. Thus, obtaining an image during the second exposure makes it possible to obtain an image brighter than the current image obtained by nondestructive readout. Thus, performing image analysis on the image that is obtained during the second exposure and that is brighter than the current image makes it possible to obtain a more correct analysis result than the case where image analysis is performed on the current image. Therefore, more suitable image processing can be performed on the current image.

Imaging device 10 further includes controller 310 that controls an exposure. In a case where determiner 320 makes the second determination for the nondestructive readout image, controller 310 causes solid-state imaging element 100 to perform a second exposure after image processor 340 obtains the current image. Image processor 340 performs the image processing on the current image using an analysis result of the image obtained as the suitable image from solid-state imaging element 100 during the second exposure.

Accordingly, the second exposure is started when a suitable image for image analysis is not obtained. In this case, the signal charge is obtained by the nondestructive readout. Thus, the signal charge generated in the second exposure is further added to the signal charge accumulated during the first exposure. In other words, the image obtained during the second exposure becomes an image brighter than a current image (image obtained when a large amount of signal charge is accumulated). Thus, performing image analysis on the image that is obtained during the second exposure and that is brighter than the current image makes it possible to obtain a more correct analysis result than the case where the image analysis is performed on the current image. Therefore, more suitable image processing can be performed on the current image.

Moreover, the second exposure is performed until the amount of signal charge reaches the first threshold.

Thus, in the second exposure, an image can be obtained when the amount of signal charge is greater than or equal to the first threshold. Since a more correct analysis result can be obtained by performing image analysis on the image, more suitable image processing can be performed on the current image.

Moreover, the second exposure is performed for a predetermined period.

Accordingly, when the amount of accumulated signal charge has reached the first threshold in the middle of the predetermined period, a plurality of image having the amount of charge greater than or equal to the first threshold can be obtained. In other words, it is possible to select an image which is more suitable for image analysis from among the images. For example, when the subject is moving, using an image at the time when the signal charge reaches the first threshold (image obtained with a shorter second exposure time) makes it possible to perform image processing for reducing the influences due to the motion (motion blur, etc.) of the subject using the image).

Moreover, in a case where determiner 320 determines that the current image from solid-state imaging element 100 by the destructive readout is obtained when the amount of signal charge is greater than or equal to the first threshold and less than a second threshold greater than the first threshold, image processor 340 performs the image processing on the current image using an analysis result of the current image obtained as the suitable image. In a case where determiner 320 determines that the current image is obtained when the amount of signal charge is equal to the second threshold, image processor 340 performs the image processing on the current image using an analysis result of an image that is obtained as the suitable image from solid-state imaging element 100 by the nondestructive readout during the first exposure and whose amount of signal charge has reached the first threshold.

Accordingly, the image to be used for image analysis for performing image processing on the current image can be selected more appropriately. In the case where the current image is obtained when the signal charge is greater than or equal to the first threshold and less than the second threshold, the current image is a suitable image and the image analysis can be performed correctly using the current image. In the case where the current image is obtained when the amount of charge is greater than or equal to the second threshold, an image obtained from solid-state imaging element 100 by the nondestructive readout during the first exposure and the amount of charge has reached the first threshold is used to perform the image analysis more correctly. Accordingly, a more correct analysis result can be obtained than the case where a current image that is obtained when the amount of charge is greater than or equal to the second threshold and that does not exhibit colors correctly is used. Since the image processing is performed on the current image using this analysis result, a more suitable image processing can be performed.

Furthermore, at least one of the suitable image and the current image is the nondestructive readout image obtained from solid-state imaging element 100 by nondestructive readout.

Thus, when a current image is obtained by nondestructive readout, image processing can be performed on the current image using the image obtained by destructive readout as a suitable image. When a current image is obtained by the destructive readout, image processing can be performed on the current image using the nondestructive readout image obtained by nondestructive readout as a suitable image.

The second threshold is an amount at which the signal charge accumulated in the plurality of pixels 210 is saturated.

Thus, the image to be used for image analysis is an image obtained when the amount of charge is less than the second threshold. In other words, since blown out highlights etc. are not generated in the image to be used for image analysis, information on colors of a subject can be obtained from the image. Thus, since image analysis can be performed on a more suitable image by setting the second threshold, image processing on a current image can also be performed more appropriately.

The image processing is white balance correction.

Thus, as the image processing, white balance correction can be performed more appropriately.

The plurality of pixels 210 each include an organic photoelectric conversion film.

Accordingly, a shutter function can be achieved by adjusting the voltage applied to the organic photoelectric conversion film, and thus a global shutter can be achieved without adding an element, such as memory. For this reason, an image having less distortion can be obtained even when the subject is moving. Therefore, image analysis can be performed using an image having less distortion.

Camera 1 according to the present embodiment includes imaging device 10, and display 500 that displays an image captured by imaging device 10.

Accordingly, since imaging device 10 is capable of performing image analysis using a suitable image, camera 1 according to the present embodiment can obtain, store, or display the current image on which image processing is performed more appropriately.

Moreover, when the second exposure is being performed, display 500 displays information indicating that the second exposure is being performed.

Thus, the user can recognize that the second exposure is being processed by checking display 500. Therefore, this can suppress the situation where the user does not recognize the second exposure is in progress and moves camera 1, and the image cannot be captured appropriately.

An imaging method according to the present embodiment includes: obtaining, from solid-state imaging element 100 that includes a plurality of pixels 210 arranged in rows and columns and configured to be read out nondestructively, a suitable image obtained when an amount of signal charge accumulated in the plurality of pixels 210 is greater than or equal to a threshold that is predetermined; and performing image analysis on the suitable image obtained (S8, S9, and S16), and performing image processing (S18), using an analysis result of the suitable image, on a current image obtained from solid-state imaging element 100 after an exposure corresponding to conditions of image capturing.

Accordingly, image processing is performed on the current image using the analysis result of the suitable image. When an image for image processing is dark (the amount of signal charge is less than the first threshold), a correct analysis result cannot be obtained by performing image analysis on such an image. Even when image processing is performed on the current image using the analysis result, it cannot be said that suitable image processing is performed. For example, when the image processing is AWB, the current image processed by the image processing may be an image that reproduces colors poorly. Imaging device 10 according to the present embodiment performs image analysis on the suitable image obtained when the amount of signal charge is greater than or equal to the first threshold, a more correct analysis result can be obtained. Since the image processing is performed on the current image using this analysis result, more suitable image processing can be performed.

Other Embodiments

The foregoing embodiment has been described to illustrate the disclosed technology, through the detailed description and the accompanying drawings.

The structural elements in the detailed description and the accompanying drawings may include not only the structural elements essential for the solution of the problem but also the structural elements not essential for the solution of the problem, to illustrate the disclosed technology. The inclusion of such optional structural elements in the detailed description and the accompanying drawings therefore does not mean that these optional structural elements are essential structural elements.

The foregoing embodiment is intended to be illustrative of the disclosed technology, and so various changes, replacements, additions, omissions, etc. can be made within the scope of the appended claims and their equivalents.

For example, an example of the image processing is white balance correction in the foregoing embodiment, but the image processing is not limited to this. Examples of the image processing may include recognition processing for identifying an individual from features such as a face of the captured subject, determination of an image capturing scene for scenery, a person, etc., and setting image quality parameters based on such recognition and determination.

This achieves effects similar to the effects in the case where the image processing is white balance correction.

Moreover, each structural component (functional block) in imaging device 10 may be separately mounted on one chip, or some or all of them may be mounted on one chip with semiconductor devices, such as an integrated circuit (IC) and a large scale integrated (LSI) circuit. Moreover, the method of circuit integration is not limited to LSI. Integration may be achieved with a dedicated circuit or a general purpose processor. After the LSI circuit is manufactured, a field programmable gate array (FPGA) or a reconfigurable processor capable of reconfiguring the connections and settings of the circuit cells in the large scale integrated circuit may be used. Furthermore, when advancement in semiconductor technology or derivatives of other technologies brings forth a circuit integration technology which replaces LSI, it will be appreciated that such a circuit integration technology may be used to integrate the functional blocks. Application of biotechnology is also a possibility.

Still furthermore, all of some of the foregoing processing may be achieved by hardware such as an electronic circuit, and, alternatively, may be achieved by software. Note that processing by software is implemented by a processor included in imaging device 10 executing the program stored in the memory. The program may be recorded on a recording medium, and may be distributed and circulated. For example, it is possible to cause a device to perform each processing described above by installing the distributed program in the device having another processor, and causing the processor to execute the program.

In the above embodiment, although an example has been described in which camera 1 includes lens 400 that allows light from outside to enter solid-state imaging element 100, the present disclosure is not limited to this. Lens 400 may be a lens removable from camera 1, for example. In this case, camera 1 does not need to include lens 400. Note that lens 400 collects light from outside and allows the light to enter solid-state imaging element 100.

The scope of the present disclosure also includes embodiments implemented by any combination of the structural elements and the functions of the above embodiment.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is widely applicable to imaging devices that capture images.

What is claimed is:
1. An imaging device, comprising:
a display that displays a captured image;
a solid-state imaging element that includes a plurality of pixels arranged in rows and columns and configured to be read out nondestructively;
a processor configured to:
when an amount of signal charge accumulated in the plurality of pixels is greater than or equal to a first threshold that is predetermined, obtain a suitable image from the solid-state imaging element;
analyze the suitable image to determine a result of the analysis;
obtain a current image from the solid-state imaging element after a first exposure corresponding to conditions of image capturing; and
perform image processing on the current image using the analysis result of the suitable image;
a determiner that determines whether an image from the solid-state imaging element is obtained when the amount of signal charge is greater than or equal to the first threshold; and
a controller that controls an exposure, wherein
in a case where the determiner makes a first determination, the processor obtains the current image from the solid-state imaging element by destructive readout, the first determination indicating that a nondestructive readout image obtained from the solid-state imaging element by nondestructive readout during the first exposure is obtained when the amount of signal charge is greater than or equal to the first threshold,
in a case where the determiner makes a second determination, the processor obtains the current image from the solid-state imaging element by the nondestructive readout, the second determination indicating that the nondestructive readout image is obtained when the amount of signal charge is not greater than or equal to the first threshold, in the case where the determiner makes the second determination for the nondestructive readout image, the controller causes the solid-state imaging element to perform a second exposure after the processor obtains the current image, the processor performs the image processing on the current image using an analysis result of the image obtained as the suitable image from the solid-state imaging element during the second exposure, and when the second exposure is being performed, the display displays information indicating that the second exposure is being performed.

2. The imaging device according to claim 1, further comprising:

a determiner that determines whether an image from the solid-state imaging element is obtained when the amount of signal charge is greater than or equal to the first threshold, wherein in a case where the determiner makes a first determination, the processor obtains the current image from the solid-state imaging element by destructive readout, the first determination indicating that a nondestructive readout image obtained from the solid-state imaging element by nondestructive readout during the first exposure is obtained when the amount of signal charge is greater than or equal to the first threshold, and in a case where the determiner makes a second determination, the processor obtains the current image from the solid-state imaging element by the nondestructive readout, the second determination indicating that the nondestructive readout image is obtained when the amount of signal charge is not greater than or equal to the first threshold.

3. The imaging device according to claim 2, further comprising:

a controller that controls an exposure, wherein in the case where the determiner makes the second determination for the nondestructive readout image, the controller causes the solid-state imaging element to perform a second exposure after the processor obtains the current image, and the processor performs the image processing on the current image using an analysis result of the image obtained as the suitable image from the solid-state imaging element during the second exposure.

4. The imaging device according to claim 3, wherein the second exposure is performed until the amount of signal charge reaches the first threshold.

5. The imaging device according to claim 3, wherein the second exposure is performed for a predetermined period.

6. The imaging device according to claim 3, wherein the second exposure is an exposure to be performed to obtain the suitable image for performing the image processing on the current image, in the case where the determiner makes the second determination.

7. The imaging device according to claim 3, wherein in the case where the determiner makes the first determination, the suitable image has a brightness less than or equal to the current image, and in the case where the determiner makes the second determination, the suitable image has a brightness greater than the current image.

8. The imaging device according to claim 2, wherein in a case where the determiner determines that the current image from the solid-state imaging element by the destructive readout is obtained when the amount of signal charge is greater than or equal to the first threshold and less than a second threshold greater than the first threshold, the processor performs the image processing on the current image using an analysis result of the current image obtained as the suitable image, and in a case where the determiner determines that the current image is obtained when the amount of signal charge is equal to the second threshold, the processor performs the image processing on the current image using an analysis result of an image that is obtained as the suitable image from the solid-state imaging element by the nondestructive readout during the first exposure and whose amount of signal charge has reached the first threshold.

9. The imaging device according to claim 2, wherein the second threshold is an amount at which the signal charge accumulated in the plurality of pixels is saturated.

10. The imaging device according to claim 1, wherein at least one of the suitable image and the current image is a nondestructive readout image obtained from the solid-state imaging element by nondestructive readout.

11. The imaging device according to claim 1, wherein the image processing is white balance correction.

12. The imaging device according to claim 1, wherein the plurality of pixels each include an organic photoelectric conversion film.

13. The imaging device according to claim 1, wherein the processor obtains a correction value for image processing on the current image based on the analysis result of the suitable image and performs the image processing on the current image based on the correction value.

14. The imaging device according to claim 1, wherein pixels of the suitable image have a predetermined brightness.

15. The imaging device according to claim 1, wherein the analysis of the suitable image determines correction values as the result of the analysis.

16. An imaging method, comprising:

determining an amount of signal charge accumulated in a plurality of pixels of a solid-state imaging element arranged in rows and columns and configured to be read out nondestructively;

when the amount of signal charge accumulated in the plurality of pixels is greater than or equal to a threshold that is predetermined, obtaining a suitable image from the solid-state imaging element;

performing image analysis on the suitable image to determine a result of the analysis;

obtaining a current image from the solid-state imaging element after a first exposure corresponding to conditions of image capturing;

performing image processing on the current image using the analysis result of the suitable image;

determine whether an image from the solid-state imaging element is obtained when the amount of signal charge is greater than or equal to the first threshold;

in a case where a first determination is made, obtain the current image from the solid-state imaging element by destructive readout, the first determination indicating that a nondestructive readout image obtained from the solid-state imaging element by nondestructive readout during the first exposure is obtained when the amount of signal charge is greater than or equal to the first threshold, in a case where a second determination is made, obtain the current image from the solid-state imaging element by the nondestructive readout, the second determination indicating that the nondestructive readout image is obtained when the amount of signal charge is not greater than or equal to the first threshold, in the case where the second determination is made for the nondestructive readout image, cause the solid-state imaging element to perform a second exposure after the obtaining of the current image, performs the image processing on the current image using an analysis result of the image obtained as the suitable image from the solid-state imaging element during the second exposure, and when the second exposure is being performed, display information indicating that the second exposure is being performed.

* * * * *